(12) United States Patent
Lesso et al.

(10) Patent No.: US 9,748,971 B2
(45) Date of Patent: Aug. 29, 2017

(54) ANALOGUE-TO-DIGITAL CONVERTER

(71) Applicant: Cirrus Logic International Semiconductor Ltd., Edinburgh (GB)

(72) Inventors: John Paul Lesso, Edinburgh (GB); Emmanuel Philippe Christian Hardy, Edinburgh (GB)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 0 days.

(21) Appl. No.: 15/243,305

(22) Filed: Aug. 22, 2016

(65) Prior Publication Data

US 2016/0359500 A1 Dec. 8, 2016

Related U.S. Application Data

(63) Continuation of application No. 14/931,332, filed on Nov. 3, 2015, now Pat. No. 9,425,813.

(30) Foreign Application Priority Data

Nov. 4, 2014 (GB) .................................. 1419651.3

(51) Int. Cl.
    *H03M 7/30* (2006.01)
    *H03M 1/18* (2006.01)
    (Continued)

(52) U.S. Cl.
    CPC ............... *H03M 7/30* (2013.01); *H03M 1/18* (2013.01); *H03M 1/181* (2013.01); *H03M 1/504* (2013.01);
    (Continued)

(58) Field of Classification Search
None
See application file for complete search history.

(56) References Cited

U.S. PATENT DOCUMENTS

| 4,186,298 A | 1/1980 | Kinbara |
| 5,293,169 A | 3/1994 | Baumgartner et al. |

(Continued)

FOREIGN PATENT DOCUMENTS

| EP | 0266682 A2 | 5/1988 |
| GB | 2502557 A | 12/2013 |
| WO | 2014011862 A2 | 1/2014 |

OTHER PUBLICATIONS

Combined Search and Examination Report under Sections 17 and 18(3), Application No. GB1419651.3, Apr. 30, 2015, 6 pages.

(Continued)

*Primary Examiner* — Howard Williams
(74) *Attorney, Agent, or Firm* — Jackson Walker L.L.P.

(57) ABSTRACT

This application relates to analogue-to-digital converters (ADCs). An ADC 200 has a first converter (201) for receiving an analogue input signal (AIN) and outputting a time encode signal (DT), such as a pulse-width-modulated (PWM) signal, based on input signal and a first conversion gain setting (GIN). In some embodiments the first converter has a PWM modulator (401) for generating a PWM signal such that the input signal is encoded by pulse widths that can vary continuously in time. A second converter (202) receives the time encoded signal and outputs a digital output signal (DOUT) based on the time encoded signal (DT) and a second conversion gain setting (GO). The second converter may have a first PWM-to-digital modulator (403). A gain allocation block (204) generates the first and second conversion gain settings based on the time encoded signal (DT). The gain allocation block (204) may have a second PWM-to-digital modulator (203) which may be of lower latency and/or lower resolution that the first PWM-to-digital modulator (403).

17 Claims, 9 Drawing Sheets

(51) Int. Cl.
*H03M 1/50* (2006.01)
*H03M 3/00* (2006.01)
*H03K 7/08* (2006.01)
*H03K 9/08* (2006.01)

(52) U.S. Cl.
CPC ............... *H03K 7/08* (2013.01); *H03K 9/08* (2013.01); *H03M 3/484* (2013.01); *H03M 2201/00* (2013.01)

(56) References Cited

U.S. PATENT DOCUMENTS

| | | | |
|---|---|---|---|
| 5,541,600 | A | 7/1996 | Blumenkrantz et al. |
| 6,445,320 | B1 | 9/2002 | Noro |
| 7,528,760 | B2 | 5/2009 | Forejt |
| 8,325,073 | B2 * | 12/2012 | Lee ................... H03M 3/492 341/143 |
| 2011/0114827 | A1 | 5/2011 | Yamaoka et al. |
| 2013/0208915 | A1 | 8/2013 | Hammerschmidt et al. |
| 2014/0334643 | A1 | 11/2014 | Pinna et al. |

OTHER PUBLICATIONS

International Search Report and Written Opinion, International Application No. PCT/GB2015/053239, mailed Jan. 28, 2016, 12 pages.

* cited by examiner

ANALOGUE-TO-DIGITAL CONVERTER

This application is a continuation of U.S. Non-Provisional Application No. 14/931332 filed on Nov. 3, 2015, issuing as U.S. Pat. No. 9425813 on Aug. 23, 2016, which claims the benefit of United Kingdom Patent Application No. GB1419651.3 filed on Nov. 4, 2014, each of which are incorporated by reference herein in its entirety.

FIELD OF DISCLOSURE

This application relates to analogue-to-digital conversion, especially to an analogue-to-digital conversion circuit with dynamic range extension, particularly for use in audio applications.

BACKGROUND

Analogue-to-digital converters (ADCs) are known and used in a variety of applications. One particular application is within audio signal paths. Increasingly audio data is being stored and transmitted in digital format. An ADC may therefore be arranged in an audio signal path to convert an analogue signal into an equivalent digital signal, i.e. digital data, which may be stored or passed on for further processing.

One particular application where ADCs are used for converting analogue audio signals detected by a microphone into a corresponding digital signal is in, for example, a portable communications device such as a mobile telephone. Increasingly such microphones are required to have a relatively large dynamic range to cope with issues such as large-amplitude interfering signals such as wind noise. Consequently the ADCs are also required to have a large dynamic range.

In such applications, to maximize the effective resolution of the ADC, it is known to apply a signal-dependent analogue gain (GIN) to the input analogue signal prior to digital conversion and to apply a corresponding inverse digital gain (GO=1/GIN) adjustment to the converted digital signal in order to compensate for the applied analogue gain change GIN. This is known as dynamic range extension (DRE). Typically, a small amplitude analogue input signal may be amplified by a large value of GIN so as to make use of more of the ADC input range, thus effectively improving the resolution of the ADC for small amplitude signals. A correspondingly large digital attenuation is applied to the digital signal to compensate for the large analogue amplification. This means that, for small signals, the quantization noise and thermal noise of the ADC may be attenuated by the low digital gain (GO=1/GIN).

SUMMARY

FIG. 1 illustrates the general principles of an analogue-to-digital converter (ADC) implementing dynamic range extension (DRE). A control block 100 adjusts the gain GIN applied to an analogue input signal AIN by an analogue gain element such as an analogue amplifier 101 so that, regardless of the peak value of the magnitude of the incoming signal AIN, the ADC 102 receives an amplified analogue signal AM (where AM=AIN.GIN) with peak values near the ADC full scale input range. The control block 100 also compensates for this analogue gain adjustment GIN by arranging for the output signal DO to be scaled by a digital gain GO, which is the inverse of the analogue gain GIN, via digital multiplier 103. The control block 100 adjusts the allocation of the gains between the analogue and digital gain elements 101 and 103 based on the amplitude or envelope of the input signal AIN. In some arrangements the envelope of the input analogue signal AIN may be determined by a suitable analogue envelope detector but preferably the digital signal produced by the ADC is used. In the example shown in FIG. 1 the output DO of the ADC 102 is used, i.e. the signal before the gain GO is applied: but equally the gain adjusted output signal DOUT could be used.

According to the present invention there is provided an analogue-to-digital converter for converting an analogue input signal into a corresponding digital output signal comprising:

a first converter for receiving said analogue input signal and outputting a pulse-width-modulated (PWM) signal based on said analogue input signal and a first conversion gain setting, said first converter comprising a PWM modulator for generating said PWM signal such that the input signal is encoded by pulse widths that can vary continuously in time, a second converter for receiving said PWM signal and outputting said digital output signal based on said PWM signal and a second conversion gain setting, said second converter comprising a first PWM-to-digital modulator; and a gain allocation block for generating said first and second conversion gain settings based on said PWM signal.

The gain allocation block may comprise a second PWM-to-digital modulator configured to receive a version of said PWM signal and output a control digital signal based on said PWM signal and a controller for receiving said control digital signal to control said first and second conversion gain settings. The second PWM-to-digital modulator may have a lower output resolution than said first PWM-to-digital modulator and/or a lower latency than said first PWM-to-digital modulator. The second PWM-to-digital modulator may comprise a first counter configured to receive a first clock signal and determine a count of the number of periods of the first clock signal during an interval defined by one or more pulses of the PWM signal.

In some embodiments the first counter may be further configured to receive a second clock signal and to output a count value every period of the second clock signal. In some embodiment the first counter is configured to reset the count value every period of the second clock signal. In some instances the PWM signal may have a fixed PWM cycle frequency and the frequency of the second clock signal may be the same as the PWM cycle frequency.

In some embodiments the second PWM-to-digital modulator may further comprise a second counter, the first counter being configured to determine a first count of the number of periods of the first clock signal during an interval of a first state of the PWM signal and the second counter being configured to determine a second count of the number of periods of the first clock signal during an interval of a second state of the PWM signal. The second PWM-to-digital modulator may then be configured to determine a duty-cycle value from said first and second counts.

The PWM modulator may comprise a comparator for comparing a signal based on the input signal with a periodic time varying reference waveform of fixed frequency. In some embodiments the excursion of the periodic time varying reference waveform may be variable based on said first conversion gain setting. The PWM modulator may be configured to output a first signal level from the start of a duty cycle until the output of the comparator indicates that the periodic time varying reference waveform has reached the same value as the signal based on the input signal and then output a second signal level until the end of the duty cycle.

In some embodiments the PWM modulator may comprise a spike generator configured to output a first signal level from the start of a duty cycle until the output of the comparator indicates that the periodic time varying reference waveform has reached the same value as the signal based on the input signal and then to output a pulse of fixed duration.

In other embodiments the PWM modulator may comprise a spike encoder configured to compare an error signal based on the input signal with a reference value and to output a pulse of fixed duration when said error signal reaches said reference value.

In further embodiments the PWM modulator may comprise a hysteric comparator configured to a signal based on the input signal to first and second limits and the switch between first and second output states when the first limit is reached and switch between second and first output states when the second limit is reached. When the gain allocation block comprises a second PWM-to-digital modulator then at least one of the first and second limits may be controllably varied based on the control digital signal produced by said second PWM-to-digital modulator.

In some embodiments the first PWM-to-digital modulator may comprise a controlled oscillator configured to output an oscillation signal at a first frequency during a pulse of the PWM signal. The controlled oscillator may be configured to output the oscillation signal at a second, different frequency, between pulses of the PWM signal. The first PWM-to-digital modulator may comprise a counter configured to count the number of oscillations of the oscillation signal in a count period. The first PWM-to-digital modulator may sometimes also comprise a signal processing module for converting the output of the counter to the digital output signal.

The first converter may comprise an analogue variable gain element for receiving the input analogue signal and applying a gain dependent on the first conversion gain setting to the input analogue signal prior to generating the PWM signal and/or the PWM modulator may have a variable gain.

The second converter may comprise a digital variable gain element for receiving a first digital signal from the first PWM-to-digital modulator and applying a gain dependent on the second conversion gain setting to the first digital signal to generate the digital output signal.

In some embodiments a controller of the gain allocation block may comprise an envelope detector for receiving the digital control signal and determining an envelope value. The gain allocation block may additionally comprise a digital gain element for applying a gain based on a third gain setting to the digital control signal prior to the envelope detector. The third gain setting may be the same as the second gain setting.

In some embodiments the analogue to digital converter may be operable in first and second modes. In the first mode the second converter may output the digital output signal based on the PWM signal. In the second mode the second converter may be inactive and an activity controller may be responsive to the digital control signal produced by the second PWM-to-digital modulator to determine whether to switch to the first mode of operation.

Any of the analogue to digital converters described above may be implemented as an integrated circuit.

The invention also relates to an apparatus comprising an analogue to digital converter as described above and a transducer, where the analogue input signal for the analogue to digital converter is generated by said transducer. The transducer may be at least one of: a microphone and a MEMS capacitive transducer.

Aspects of the invention also relate to an electronic device comprising an analogue to digital converter as described above. The device may be at least one of: a portable device; a battery powered device; a communications device; a mobile or cellular telephone; a personal media device; a computing device; a laptop, notebook or tablet computer; a gaming device; a wearable device. The device may be a voice activated device and/or operable in a voice controlled mode.

The invention also relates to a method of analogue to digital conversion. Thus in another aspect there is provided a method of converting an input analogue signal to a corresponding digital output signal comprising:
  generating a pulse-width-modulated (PWM) signal based on said input analogue signal and a first conversion gain setting, such that the input analogue signal is encoded by pulse widths that can vary continuously in time,
  generating said digital output signal based on said PWM signal and a second conversion gain setting; and
  generating the said first and second conversion gain settings based on the PWM signal.

The method may be operated with any of the variants described above in relation to the first aspect of the invention.

In a further aspect there is provided an analogue to digital converter for converting an analogue input signal into a corresponding digital output signal comprising:
  a first time encoding converter for receiving said analogue input signal and outputting a time encoded signal based on said analogue input signal and a first conversion gain setting, wherein the time encoded signal encodes the input signal by the timing of signal transitions that can vary continuously in time,
  a first time decoding converter for receiving said time encoded signal and outputting said output digital signal based on said time encoded signal and a second conversion gain setting; and
  a gain allocation block for generating the said first and second conversion gain settings based on the time encoded signal.

In a further aspect there is provided an analogue to digital converter as claimed in claim 35 wherein the gain allocation block comprises a second time decoding converter for receiving said time encoded signal and outputting a control digital signal based on said time encoded signal and a controller for receiving said control digital signal and controlling the said first and second conversion gain settings.

In a yet further aspect there is provided an analogue to digital converter comprising:
  a first gain element for applying a first controlled gain to an input analogue signal; a first modulator for converting a gain controlled input analogue signal output from said first gain element into a PWM signal,
  a second modulator for converting said PWM signal into a digital signal;
  a second gain element for applying a second controlled gain to the digital signal output from said second modulator to produce an output digital signal; and
  and a gain allocation block for controlling said first and second controlled gains, wherein said gain allocation block comprises a third modulator for receiving a version of said PWM signal and generating a digital signal indicative of the input analogue signal.

In a further aspect there is provided an analogue to digital converter comprising: a first converter for converting an input analogue signal to a PWM signal; a second converter for converting the PWM signal to a digital signal; and a gain allocation block for controlling an analogue gain of the first converter and a digital gain of the second converter; wherein the gain allocation block is configured to control said analogue gain and said digital gain based on the PWM signal.

The gain allocation block may comprise a third modulator for converting the PWM signal to a digital signal wherein the third modulator converts the PWM signal to a digital signal with a lower latency than the second modulator. The first converter may be configured such that the PWM signal encodes the input analogue signal by the duration between signal transitions and the possible encoding durations are not quantized. The first converter may be configured such that the PWM signal encodes the input analogue signal by the duration between signal transitions and at least one of said signal transitions is not constrained to be synchronized with a clock signal.

In a further aspect there is provided an analogue to digital converter for converting an analogue input signal into a corresponding digital output signal comprising: a time encoding block for converting said analogue input signal to a time encoded signal with a first conversion gain; a time decoding block for converting the PWM signal to said digital output signal with a second conversion gain; and a gain allocation block coupled to an output of the time encoding block to receive a version of the PWM signal and configured to control said first and second conversion gains based on the received PWM signal In a further aspect there is provided an analogue to digital converter for converting an analogue input signal into a corresponding digital output signal comprising: a first converter for converting said analogue input signal to a PWM signal according to a first conversion gain; a second converter for converting the PWM signal to said digital signal according to a second conversion gain; a third converter for converting the PWM signal to a digital control signal; and a gain controller for controlling said first and second conversion gains based on said digital control signal.

In a yet further aspect there is provided an analogue to digital converter comprising:
a time encoding block;
a time decoding block; and
a gain allocation block;
an input of the analogue to digital converter being coupled to an input of the time encoding block;
an output of the analogue to digital converter being coupled to an output of the time decoding block;
an output of said time encoding block being coupled to an input of said time decoding block input and an input of said gain allocation block;
an output of said gain allocation block being coupled to a conversion gain control input of said time encoding block; and
an output of said gain allocation block being coupled to a conversion gain control input of said time decoding block.

BRIEF DESCRIPTION OF THE DRAWINGS

For a better understanding of the present invention and to show how it may be put into effect, reference will now be made, by way of example, to the following drawings, in which.

DETAILED DESCRIPTION

Embodiments of the present invention relate to analogue-to-digital converters (ADCs) that implement time encoding as part of the conversion of an analogue input signal to a digital output signal. The analogue input signal is used to produce an intermediate signal which is a time encoded signal. As will be explained in more detail below a time encoded signal is a signal comprising a sequence of time intervals between physical signal transitions, wherein the duration of at least some of the intervals are modulated in response to the current or contemporaneous input signal. The time encoded signal may be a pulse-width-modulated (PWM) signal. This intermediate, time-encoded, signal is then decoded into a stream of conventional digital values to provide the required digital output signal.

To extend the dynamic range of the ADC a first conversion gain GIN may be applied to the input analogue signal, with an inversely controlled conversion gain GO being applied to provide the digital output signal. In embodiments of the present invention the allocation of the conversion gains may be determined based on the intermediate signal, i.e. the signal which is time encoded, rather than the analogue input signal or the output digital signal.

Figure 1:
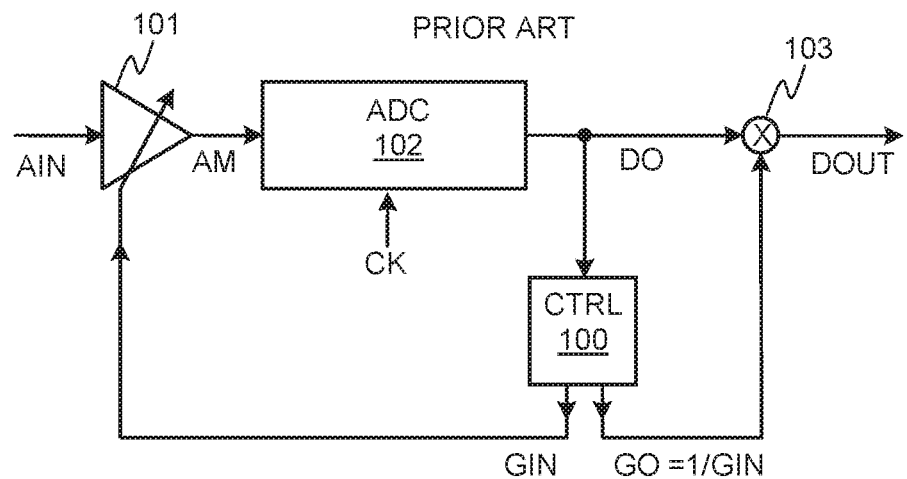
FIG. 1 illustrates an analogue-to-digital converter with dynamic range extension.
Figure 2:
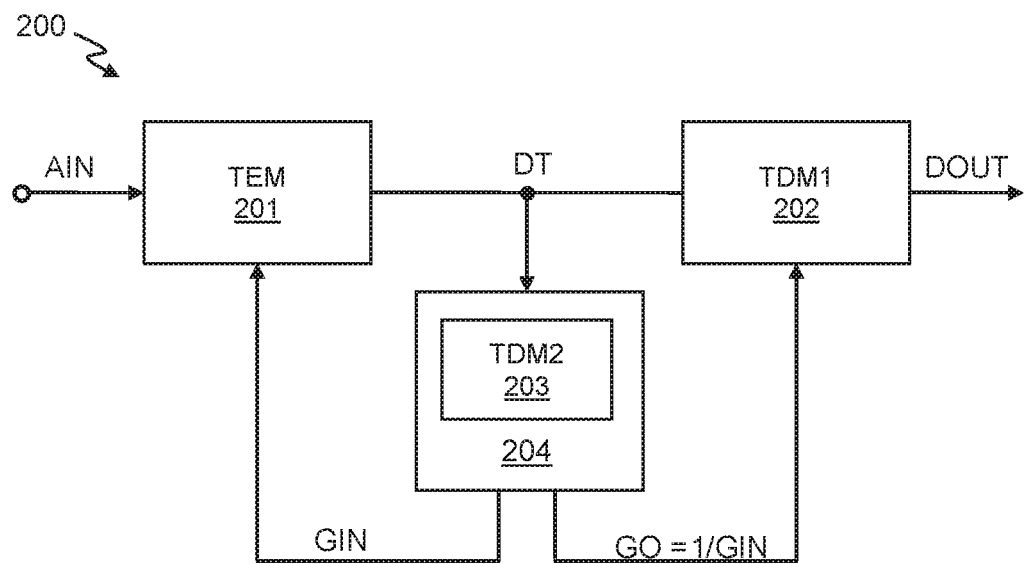
FIG. 2 illustrates the general principles of analogue-to-digital conversion with dynamic range extension according to embodiments of the invention.

FIG. 2 illustrates generally the principles of embodiments of the invention. FIG. 2 illustrates that an ADC 200 comprises three converters. A first converter 201 is a time encoding converter (TEC) or time encoding machine (TEM) arranged to convert the analogue input analogue signal AIN into the time encoded signal DT with a conversion gain GIN. A second converter 202 is a time decoding converter (TDC) or time decoding machine (TDM) and is configured to convert the time encoded signal DT into a digital output signal DOUT with a conversion gain GO. The first converter 201 and second converter 202 are therefore arranged in a main conversion signal path of the ADC and the time encoded signal DT is an intermediate signal of this main conversion path. A third converter 203, which is another TDC or TDM is arranged as a part of a gain allocation block 204, to receive and decode a version of the time encoded signal DT. This third converter 203 may thus provide a control digital signal, i.e. a digital representation of DT and hence of AIN from which an indication of the amplitude of AIN may be derived from which in turn the gains GIN and GO may be controlled.

This general architecture is advantageous in a number of ways. Preferably the process and/or circuitry of time encoding is not substantially quantized in time, so that the initial conversion by the first converter 201 does not introduce any significant quantization noise. In other words the time encoded signal may be encoded such that the time intervals between signal transitions that are used for encoding are continuously variable in time, as will be explained in more detail below.

Also, since there is no quantization taking place, there may be no need for banks of matched or ratioed analogue elements such as switched capacitors to implement multi-bit conversions. Conversion from the input analogue signal to a time encoded signal may thus be implemented more easily in small-geometry semiconductor processes than direct conversion of an amplitude to digital.

Conversion from a time encoded signal to a digital output signal may also be implemented using relatively simple compact blocks such as voltage-controlled ring oscillators suitable for small-geometry semiconductor processes. The overall size and cost of the ADC may therefore be relatively small and for instance may be particularly suited for use with small and cost sensitive transducers such as MEMS or electret microphones.

In addition the use of separate converters in this way, in particular the use of separate time decoding converters for the main signal path and for the gain allocation path allows each respective converter to be optimized independently for the respective function. For instance the second converter 202 may be optimized for signal-band signal to noise while the third converter 203 is optimized to give lower latency and thus allow the dynamic gain allocation to respond more quickly to sudden increases in signal level and thus avoid overload of the first converter due to fast high-amplitude steps or transient impulses in the input audio signal, for example a drum rim-shot or castanets after a period of quietness. As will be described in more detail below the use of separate converters allows the second converter 202 to be optimized in ways that may mean it would not be suitable for providing an indication of the input signal for the gain controller. In addition the first converter may be separately optimized for reducing distortion such as THD.

As mentioned above a time encoded signal DT comprises a sequence of time intervals between defined signal transitions from one state to another, wherein the duration of each interval is modulated to convey a relevant input signal value, i.e. the then current or contemporaneous input signal value at the converter.

The time encoded signal may, for instance, be a voltage signal, for example switching between one state defined by a high voltage level and a second state defined by a lower voltage level, for instance a conventional digital logic level. The value of these voltage levels is unimportant—all the information is contained in the timing between specified transitions between one state and another. The timing of each transition may be defined by when the physical voltage passes a defined voltage threshold between high and low logic states.

A time encoded signal may comprise a pulse-width-modulated (PWM) signal in which a series of pulses of variable width each encode the value of the respective then current input signal by the width of a respective pulse, i.e. the timing between rising and falling edges of each voltage pulse.

As mentioned above the time encoded signal may be encoded such that the relevant time intervals that encode the value of the input signal, e.g. the pulse widths of pulses of a PWM signal, may vary continuously in time. By vary continuously in time is meant that the timing of at least one of the signal transitions used to define the interval may vary effectively continuously, at least within a given range, e.g. a PWM duty cycle period. In other words the relevant interval is not substantially quantized and the time interval can vary continuously with the value of the input signal to be encoded.

Thus, for example, consider a time encoded signal wherein the present input signal value is encoded by the duration of a pulse defined by a first signal transition and a second signal transition. The pulse width may be variable between a minimum duration, e.g. zero, and a maximum duration, e.g. equal to a fixed sample period. In embodiments of the present invention the pulse duration may vary continuously, that is may take substantially any value, between these minimum and maximum durations. The encoding in time is therefore effectively analogue.

In some embodiments one of the relevant signal transitions may be synchronized to clock signal, i.e. synchronized to a clock edge. For instance, the first signal transition defining the start of each pulse may be synchronized with a clock signal, e.g. a clock signal at a suitable PWM cycle or sample frequency. This signal transition may thus be constrained to occur at a time defined by this clock signal. The second signal transition may however vary continuously with time depending on the value of the input signal to be encoded, thus the second signal transition may occur at substantially any time during the cycle period depending on the value to be encoded.

In some embodiments at least one of the signal transitions may be unconstrained in time. In other words the timing of the signal transition is not defined by, or constrained to be synchronized with, any clock signal and may occur at any time, at least within the relevant period. Thus the time resolution of the encoding interval is not constrained, at least not constrained by a clock signal. For instance, in the example above the second signal transition may be unconstrained in time, i.e. not constrained to occur at a time defined by a clock signal. In this way the pulse width defined by the first and second signal transitions is not quantized at all (in the sense of being constrained to one of a set of possible values) and any value of input signal (within a defined input range) can be encoded by a suitable width pulse. It will of course be appreciated that alternatively the end of the pulse could be constrained to be synchronized to a clock edge and the start of the pulse could be unconstrained and free to occur at any time. In some embodiments both relevant signal transitions may be unconstrained.

In some embodiments, as will be described below, there may be some constraint on the timing of the intervals but at a sufficiently high time resolution such that the time interval effectively varies continuously. For example the start of the pulse may be constrained to occur at the start of a cycle period defined by a cycle clock signal at a first frequency, say $f_{PWM}$. The end of the pulse may also be constrained to be synchronized to a clock edge of a fast clock signal which has a frequency which is significantly greater than the first frequency, say of the order of 1000 times greater or more, e.g. at least 5000 times faster. This means that the relevant time interval has a time resolution such that there are at least 1000 different pulse durations that can be encoded and in some embodiments at least 5000 different pulse durations. For the purposes of a time encoded signal a pulse interval with a time resolution of the order of at least 1000 different possible encoding values shall be taken to be continuously variable and not substantially quantized. Strictly this does mean that there is some quantization of the possible interval values, but at a resolution which is such that there is no significant quantization noise.

FIGS. 3a to 3d illustrate waveforms of various non-restrictive examples of PWM time encoded signals.

Figure 3A:
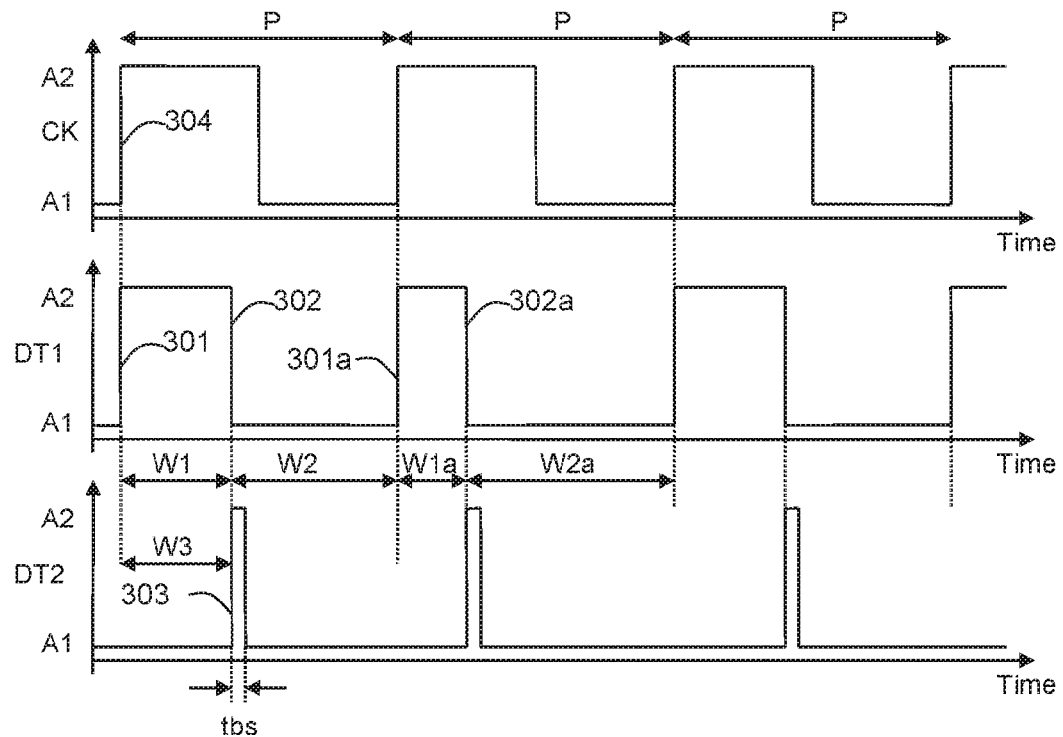
FIGS. 3a-3d illustrate examples of time encoded PWM signals.

FIG. 3a illustrates an example DT1 of the time encoded signal DT which is a PWM signal with a fixed PWM sample rate or fixed PWM clock frequency $f_{PWM}$ or equivalently a fixed duty cycle period P. The signal DT1 comprises two states of nominal voltages A1 and A2. In this example there is a signal transition 301 from low to high states at the start of each duty cycle period defined by an applied clock waveform CK and DT1 remains high until there is a transition 302 from high to low at a certain time within the duty cycle period. The value of the input signal is encoded by the duration between the first transition 301 and the second transition 302, i.e. by the width W1 of the pulse of high signal level, or alternatively by the duration between the transition 301 and the transition 301a starting the next duty cycle period, i.e. the width W2 (equal to P−W1). In the next clock cycle, the value of the input signal may be different, and will be encoded by a different value of pulse width W1a (or W2a) as illustrated, but the total duration of W1a and W2a is still the CK clock period P. Note that whilst the timing of transition 301 of each duty cycle period may be synchronized to some suitable clock signal CK the timing of transition 302 is not constrained to be synchronized to the edge of any clock, and can vary anywhere within substantially the whole range of the duty cycle period. It will of course be appreciated that the transition 301 could instead be a high-to-low transition and transition 302 could be a low-to-high transition.

FIG. 3a illustrates that a pulse of signal DT1 transmitted to downstream circuitry which encodes the variable value, e.g. the pulse of high signal level of width W, may be substantially a constant voltage over the timespan of W. FIG. 3a also illustrates an example DT2 of the signal DT when the time encoding modulator 201 is a fixed frequency PWM spike encoder. In this example, the PWM signal comprises pulses or spikes with a low duty cycle. In this example the spikes are short pulses of a high signal state but again it will be appreciated the spike could comprise a short pulse of low signal state. In this example there is again a fixed duty cycle period P defined by the clock CK. The value of the input signal may be encoded by the timing of the occurrence of the spike within the duty cycle period, e.g. the duration W3 between the start of the duty cycle period as defined by an edge 304 of the clock CK and the occurrence of the spike. The timing of the spike could be determined by detecting the rising edge of the spike, i.e. a transition 303 from high-to-low. In effect this represents detecting the edge of a virtual pulse that started at the start of the duty cycle period in the same way as described above with respect to DT1.

Since only the leading edge of the spike contains useful information, the duration (tsp) of the spike is unimportant. However since the maximum encoded time corresponds to the clock period P minus the duration of the spike, tsp may advantageously be as short as practicable in order to maximize the range of encoded time. Alternatively the timing of the spike could be detected by detecting the position of the falling edge of the spike if tsp is well controlled, or in either case the polarity of the spike or the clock edge used could be inverted.

It will be appreciated that to decode the signal DT2 will require knowledge of the timing of the relevant clock edge 304. This is an example where the time encoded signal is carried on more than one wire. The time encoded signal is actually represented physically by edges on both the clock line carrying clock CK and the signal line carrying the PWM signal spikes.

Figure 3B:
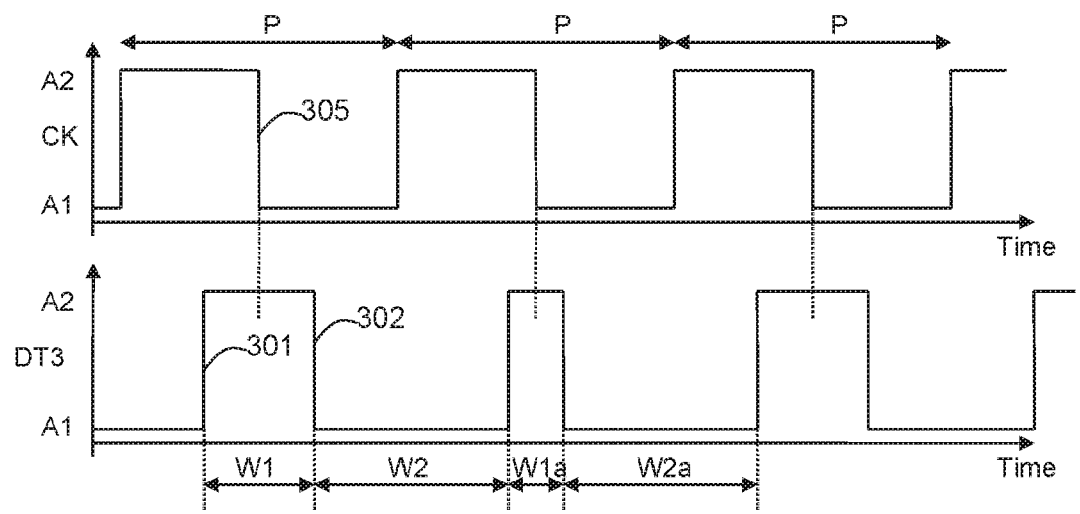

FIG. 3b illustrates an embodiment in which time encoded signal is realized as a PWM signal DT3 in which the duty cycle period is constant but the timing of both the rising 301 and falling edges 302 varies with the input signal to be encoded, i.e., double edge modulation rather than single edge modulation. The edges of each pulse may or may not be symmetric with respect to an edge 305 of the applied clock CK. The input signal may be regarded as encoded by the width W1 of the high level state or the width W2 of the low level state.

Figure 3C:
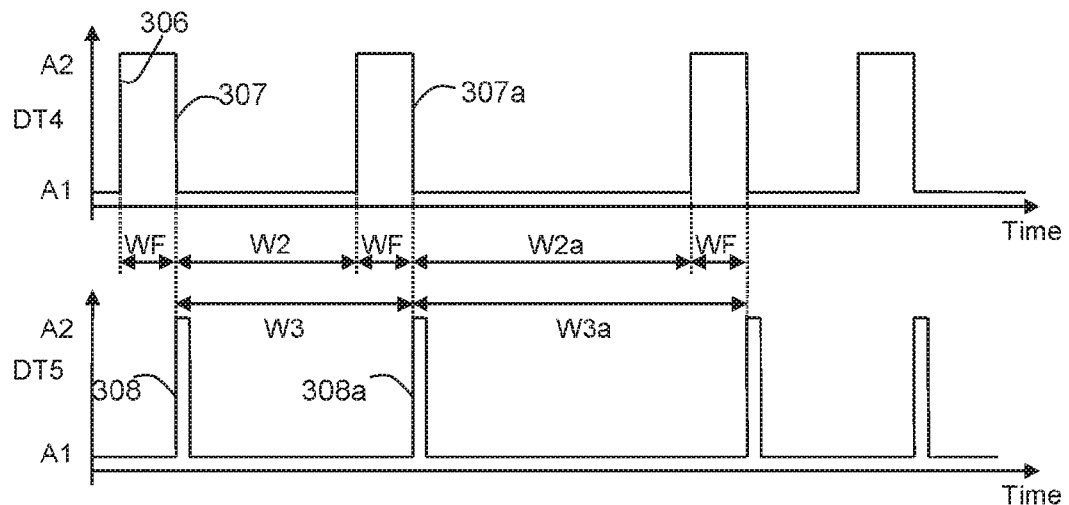

In some embodiments however the duty cycle period is not constant. For instance, in constant-on-time PWM modulation, as illustrated in FIG. 3c. Waveform DT4 comprises high-level or "on" pulses of fixed width WF (in this example defined by a rising edge 306 and falling edge 307) and the value of the signal may be encoded by the duration between "on" pulses, i.e. the width W2 of an "off" pulse. It may also be regarded as being encoded by the duration W3, between consecutive falling edges, e.g. 307, 307a, of DT4. The width or duration of each cycle W3 is the sum of the fixed duration WF and the variable width W2 so will vary as W2 varies.

FIG. 3c also illustrates an example DT5 of the signal DT where each falling edge of DT4 is marked by a leading edge 308, 308a of a short pulse or spike. This format of signal makes it more obvious that the frequency of these spikes will vary with signal: One skilled in the art will appreciate that a signal such as illustrated in FIG. 3c may in some respects be considered as a pulse-frequency-modulated (PFM) signal.

Figure 3D:
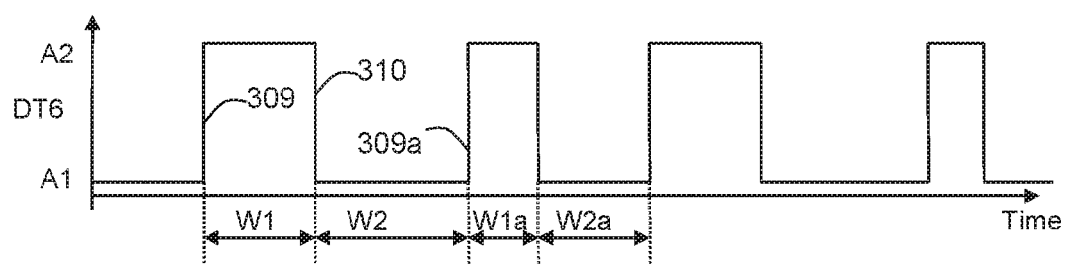

In some embodiments, both the width of the pulses and the time between pulses may be independently variable, i.e. the width of an "on" pulse and an "off" pulse are both variable and both involved in the encoding. For instance the PWM modulator may be a self-oscillating PWM modulator (otherwise known as a hysteretic PWM modulator or an asynchronous delta-sigma modulator). FIG. 3d illustrates an example DT6 of the signal DT when the PWM modulator of converter 201 is a self-oscillating modulator. In this example, W1 is the width a pulse of high level, i.e. the duration between a transition 309 and a transition 310, and W2 is the width W2 of the following low level pulse, i.e. the duration between the transition 310 and the transition 309a. The current value of the encoded variable is still represented by the duty-cycle of W1 and W2, e.g. (W1−W2)/(W1+W2). However both W1 and W2 (and thus also W1+W2) typically vary non-linearly with the input signal, so cannot be used on their own to convey a low distortion version of the signal. However the value of the input signal is accurately coded by the duty cycle at every (variable) period.

In this example, the converter or PWM modulator has more degrees of freedom in where to position the edges, so this results in better distortion performance. However since the output is does not have a constant sample frequency, there are complications in recovering a constant-sample-rate signal therefrom.

In all of these examples, while one edge may be fixed relative to an applied clock edge, the possible values of the relevant encoding pulse width W (W1, W2, etc.) are continuous or analogue in time. For example, in FIG. 3a, W1 may equal any value in substantially the whole range between zero and P. Therefore, the signal DT, in all of the described cases, is not time quantized with respect to encoding the value of the input signal. As there is no time quantization of the encoded values any noise produced by this stage of analogue-to-digital conversion is purely due to thermal noise and suchlike of the analogue circuitry involved.

It will of course be appreciated that the conversion from the analogue signal to a time encoded signal does mean that there is some sampling in time, for instance only one signal value may be encoded in a duty cycle period, but the value which is encoded is not quantized.

As mentioned above there are variants of these time-encoded signals where both edges defining a relevant encoding duration may be quantized in time, for example synchronized to some higher-frequency clock. Preferably, in such a case, this time quantization is relative to some clock that is of much higher frequency than the duty cycle frequency or PWM clock rate $f_{PWM}$, e.g. at least 1000 times greater or more, so the quantization noise is not significant relative to the sampling frequency of the system taking into account the noise performance required and other noise sources such as circuitry thermal noise. For example the PWM pulse edges could be quantized to a 3 GHz sync clock relative to a 384 kHz PWM sample rate. In this example the sync clock is thus running about 7,800 times faster than the sample rate clock, meaning that the PWM pulses may take any of about 7,800 different values and as such the time interval is effectively continuously variable in time with the input value to be encoded.

It will also be noted that the duty cycle calculated from the widths of the relevant pulses in each cycle accurately represents the current value of the analogue signal. This contrasts with other coding techniques, for example conventional delta-sigma modulation where the analogue signal is represented as a rapid sequence of coarse-resolution (possibly two-level) equal width pulses, from which the actual analogue signal can only be reconstructed by averaging the density of these pulses over many delta-sigma clock cycles, in order to remove the high frequency quantization noise. In contrast, a time encoded signal may be immediately decoded to provide an accurate representation of the original analogue input signal AIN with little added latency ready for immediate use.

Figure 4A:
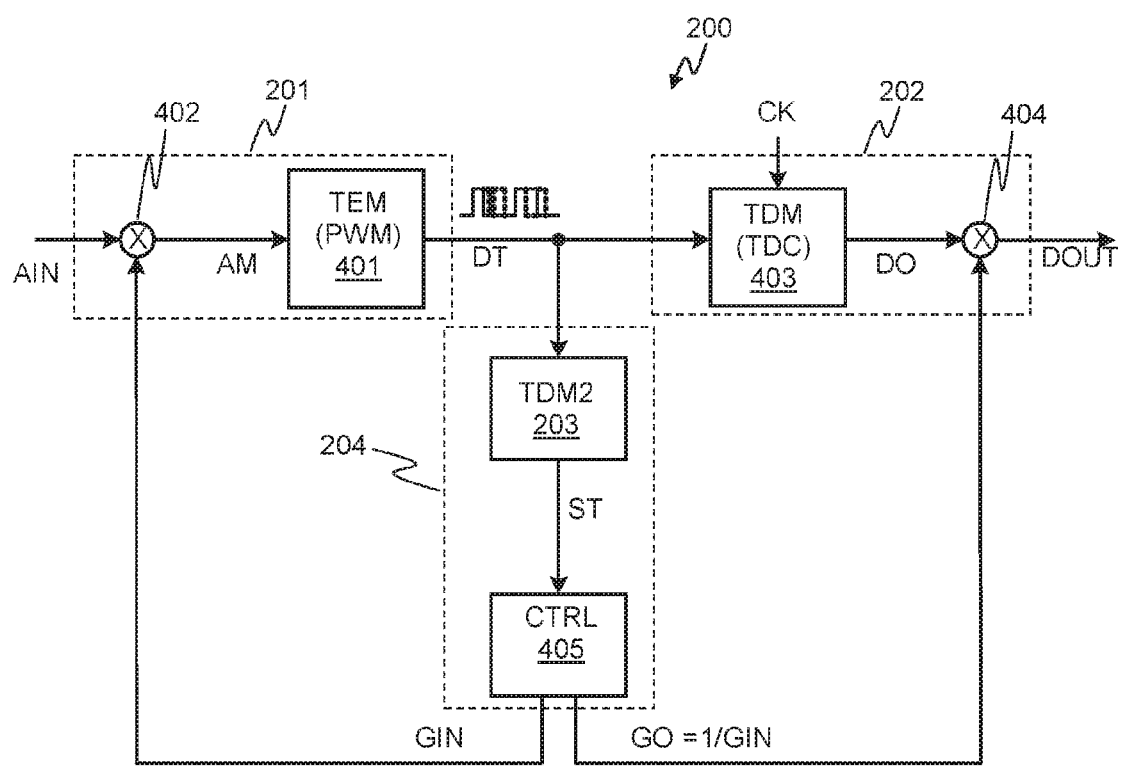
FIGS. 4a and 4b illustrate analogue-to-digital conversion circuits with dynamic range extension according to embodiments of the invention.

FIG. 4a illustrates a more detailed embodiment of the ADC circuit 200 of FIG. 2. The first converter or time encoding block 201 comprises at least a time encoding modulator 401 which generates the time encoded signal DT based on the analogue input signal AIN and a first conversion gain setting GIN. The modulator 401 may be a pulse-width-modulator (PWM). Examples of the possible structures of the modulator are described later with reference to FIGS. 5 and 6.

In some embodiments of the invention, the first converter 201 may also comprise an analogue variable gain element 402 (as shown in this figure) for producing a gain controlled analogue signal AM used as the input to modulator 401. In some other embodiments (not illustrated in this figure), the gain of the modulator 401 itself may be variable in response to GIN.

The encoded digital signal, e.g. PWM signal, DT is input into the second converter (a time decoding block) 202 which converts the time encoded signal DT into a digital output signal DOUT.

The second converter or time decoding block 202 generates the digital output signal DOUT based on the time encoded signal DT and a second conversion gain setting GO, and comprises a first time decoding modulator 403. As used herein the first time decoding modulator 403 is a modulator that receives time encoded signal DT and outputs a decoded digital signal DO. The first time decoding modulator 403 may be a first PWM-to-digital converter. The decoded digital signal DO may be in some chosen convenient digital format. As will be understood the decoded digital signal DO is quantized in signal level and the transitions in signal level may be quantized in time according to the particular digital format. An example of the structure of a time decoding modulator 403 is described later in reference to FIG. 7a.

In some embodiments of the invention the second converter or time decoding block 202 comprises a digital gain element 404, as illustrated in FIG. 4a, which changes a gain applied to the modulator output signal, i.e. the time decoded signal, DO to produce the digital output signal DOUT in some convenient digital format. Alternatively or additionally, the gain of the modulator 403 may be variable in response to GO, in which case signal DO may be usable directly as DOUT.

A gain allocation block 204 controls first and second conversion gain settings GIN, GO which are provided to the first converter or time encoding block 201 and the second converter or time decoding block 202 respectively so as to allocate gain, e.g. applied by the analogue variable gain element 402 and the digital variable gain element, 404 respectively. In embodiments of the invention the gain allocation control is based on the intermediate time encoded signal DT and thus the gain allocation block 204 receives the time encoded signal DT produced by the first converter 201.

The gain allocation block 204 controls the gain of the first converter or time encoding block 201 so that there is a greater gain GIN when the analogue input signal AIN, as determined from the time encoded signal DT, is smaller, and less gain GIN when the amplitude of the analogue input signal AIN is larger. This maximizes the dynamic range of the ADC 200 without causing any clipping of the output signal DOUT. As mentioned above the gain allocation block 204 may comprise a third converter 203, which in this example may be a second or auxiliary time decoding modulator 203 (e.g. a second PWM-to-digital modulator). The auxiliary modulator 203 is for producing a digital signal ST representative of the analogue input signal AIN with a scaling factor equal to GIN, (e.g. representative of AM in embodiments where AM is present as an actual signal). The representative digital signal ST is input into a gain controller 405 which determines the first and second conversion gain settings GIN and GO. In this embodiment the values of the first and second gain settings GIN and GO may be controlled such that GO=1/GIN so that the applied digital gain GO compensates exactly for the applied analogue gain GIN. Other arrangements are possible however, for instance the gain allocation controller may also apply a further constant or independently controlled gain factor to alter the gain between AIN and DOUT. This gain factor may be set or vary in response to a user input, for example a manual gain control. Such additional gain factor may also depend on an indication of signal level at some point in the analogue to digital converter or somewhere else in the host device or system in order to apply some automatic gain control function.

It will be appreciated by one skilled in the art that the conversion gain of the first converter 201, i.e. the conversion gain between the input signal and the intermediate time encoded signal is strictly the ratio of DT to AIN, for example in units of ns/V. Thus in the embodiment of FIG. 4*a* the conversion gain of the first converter will depend on the gain applied by the analogue gain element 402 and the gain of the modulator 401 (and any other signal processing components in this part of the signal path). Likewise the conversion gain of the second converter 202 is strictly the ratio of DOUT to DT, for example in LSB per ns and thus depends on all components within the converter 202. For clarity, in the explanation above, for instance in relation to embodiments such as illustrated in FIG. 4*a*, it has been assumed that the collective gain of any elements of the converter, other than the relevant variable gain element, is effectively defined as, or normalized to, unity. Thus it has been assumed that the first conversion gain setting effectively defines the conversion gain of the first converter and the same label, GIN, has therefore been used to refer interchangeably to the gain setting and the resultant conversion gain. It will be appreciated that if the gain of the other elements of the converter is not defined as or set to unity that the relevant overall conversion gain may therefore not correspond exactly to the relevant gain setting, but clearly controlling the relevant gain setting will still control the relevant conversion gain. It will also be appreciated that the actual conversion gain settings conveying GIN and GO, i.e. the control signals from the gain allocation block 204, may themselves have scaling factors or not be in conventional binary-coded number formats. The skilled artisan would readily make any necessary allowances for the various fixed scaling factors and formats of the physical signals which have been omitted from the discussion for simplicity of explanation.

Embodiments of the present invention thus apply dynamic range extension (DRE) techniques to an ADC based on time encoding where the time encoded signal is used to control the allocation of gain between the analogue input signal AIN and the digital output signal DOUT. An indication of the amplitude of the analogue input signal AIN is thus not determined from the analogue input signal AIN directly but rather may be determined from a converted digital representation, i.e. a digital converted version, DT of the input signal. The predominantly digital signal processing involved is better suited to implementation on a small geometry integrated circuit than an analogue level or envelope type detector coupled to the analogue input signal itself that might otherwise be required.

The digital output signal DOUT is, of course, a digitized version of the analogue input signal, from which an indication of the amplitude of the input signal and thence a gain allocation control might be derived. However in many applications the processing applied to produce the digital output signal DOUT may involve a signal processing delay. For instance consider that the digital output signal DOUT required is a multi-bit pulse-code-modulation (PCM) word at a base audio sampling frequency fs, or a relatively small multiple thereof, e.g. 8.fs. The second converter 202 may in such instances comprise a decimator to reduce the sampling frequency down to that required and this will typically involve filtering to low-pass filter quantization noise. In such a case the second converter 202 may have an inherent signal processing delay, as well as possibly some computational delay. Alternatively in some cases, e.g. in use in a digital microphone application, a single-bit output may be required. The digital signal DOUT is then just a two-level signal, and requires some decimation or low-pass filtering to increase the word length to allow the gain control to be applied again resulting in signal processing delay. This signal processing delay may be acceptable and indeed necessary to produce the digital output signal DOUT with adequate quality, e.g. signal-to-noise. However for dynamic range extension it is necessary for the gain allocation block 204 to respond rapidly to any increases in input signal AIN amplitude to avoid signal clipping. The processing delays referred to above may mean that the digital signals produced by the time encoding block 202, e.g. the overall output DOUT or even the output DO from the modulator 403, are not suitable for use for gain allocation control.

In embodiments of the present invention therefore the modulator 403 in the output path, e.g. the first PWM-to-digital modulator, may be designed appropriately for the required performance and format of the main digital output DOUT whilst the auxiliary modulator 203 (e.g. the second PWM-to-digital modulator) is designed appropriately for producing a signal indicative of the amplitude of the input signal AIN that can be used for gain allocation control. For instance the auxiliary modulator 203 may produce a digital signal with a lower latency (i.e. the overall delay involved in converting the time encoded signal to a digital signal) than the first modulator 403. Additionally or alternatively the auxiliary modulator 203 may produce a lower resolution signal ST than the signal DO output from the modulator 403. Examples of auxiliary modulators 203 will be described later with reference to FIGS. 8 and 9.

Figure 4B:
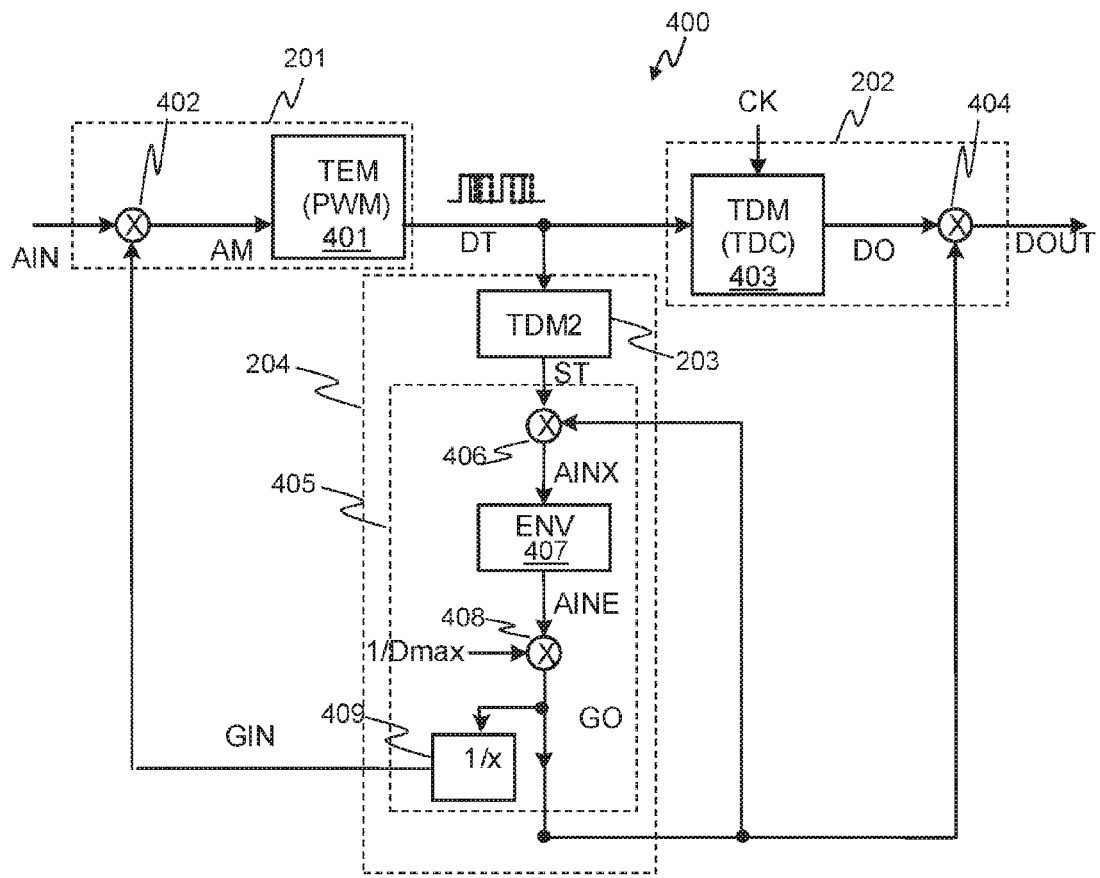

FIG. 4*b* illustrates an analogue-to-digital conversion circuit 400 with dynamic range extension according to an embodiment of the invention, and illustrating an embodiment of the gain allocation block 204 in more detail. Components in this figure which are similar to those described in reference to FIGS. 2 and 4*a* have been given the same references.

In this embodiment, the controller 405 of the gain allocation block 204 comprises a variable gain element 406 which multiplies the output signal ST of the auxiliary modulator 203 by the second conversion gain setting GO. Since GO is the inverse of the first conversion gain GIN of the first converter (ignoring signal scaling factors) this compensates for the conversion gain GIN to produce a signal AINX which is representative of the input signal AIN. Note that there may be some delay (not illustrated) between the output of controller 405 providing the second conversion gain GO and the gain element 406 to match any processing delay though the first converter 201 and auxiliary modulator 203 to synchronize changes in the second conversion gain setting GO applied to the signal ST to the arrival time of signal affected by the corresponding change in GIN to avoid artefacts due to mismatched gain compensation.

The signal AINX is input into an envelope detector 407 to produce an envelope signal AINE. The envelope detector may comprise an absolute value module (not shown) for determining the magnitude of the signal (e.g. by simply dropping the sign bit) prior to envelope detection. The envelope detector 407 may be configured so that the attack coefficient is relatively fast so that the gain allocation block 204 can respond quickly to any increases in input signal AIN amplitude to reduce the gain GIN applied to the input signal AIN and avoid the gained input signal AM from saturating the PWM modulator 401. The envelope detector 407 may also be configured to have a relatively slower decay coefficient as it may be desired to avoid rapid variations in gain at the frequencies similar to the signal of interest to avoid possible audible artefacts. The envelope detector 407 may in some embodiments apply a delay between any reduction in detected amplitude level and reducing the envelope value for a similar reason. The envelope detector may also comprise some frequency-dependent pre-emphasis function or phase advance to exaggerate fast signal edges so that the adjustment of GIN may anticipate such edges and reduce the gain GIN applied before a fast-slewing input signal arrives at gain element 402 despite any processing delay in the loop.

Figure 6:
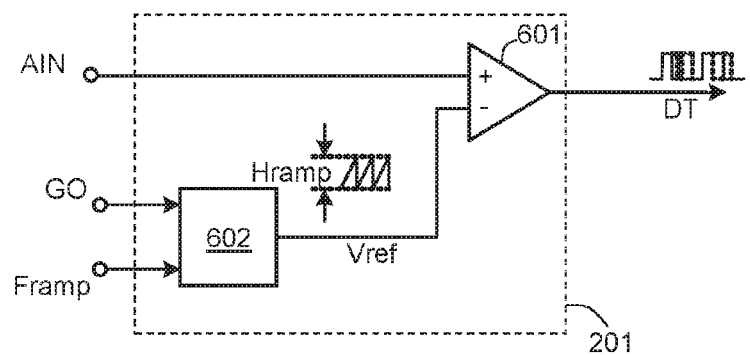
FIG. 6 illustrates an alternative first converter (time encoding block) according to an embodiment of the invention.

The envelope signal AINE is a representation of the envelope of the input signal AIN. In this embodiment the value of the envelope signal AINE is scaled by the inverse of a value Dmax by multiplier 408, where Dmax represents the maximum output amplitude of the ADC 500. The result is the second conversion gain setting GO. The first gain setting GIN can then be derived as the reciprocal of the second gain GO setting by reciprocal block 409. This gives the first gain setting GIN which maximizes the dynamic range of the first converter 201. As will be described below however in some embodiments, for example when the PWM modulator 401 described with reference to FIG. 6 is implemented in the first converter 201, the gain signal GIN may not be explicitly calculated and the gain setting GO can be input into both the first converter 201 and the second converter 202.

In some embodiments, rather than first calculate GO as AINE/Dmax and then derive GIN as 1/GO, GIN may be calculated first as Dmax/AINE and then GO derived as 1/GIN. The value of GIN (or GO if calculated first) may be limited to a maximum and/or minimum value, for example to avoid excessive analogue hardware requirements in order to implement the range of analogue gain.

Figure 5:
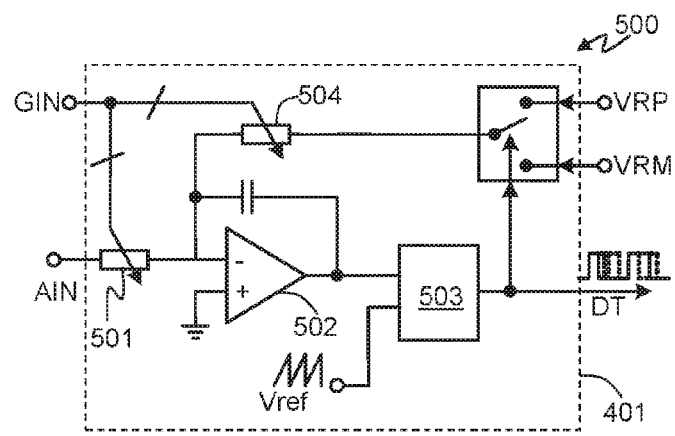
FIG. 5 illustrates an example of a first converter (time encoding block) according to an embodiment of the invention.

FIG. 5 illustrates one example of a circuit 500 suitable for the first converter 201, i.e. the time encoding block. In this example, the first converter 201 comprises a PWM modulator 401 with variable gain.

The analogue input signal AIN is input via a variable impedance element 501, whose impedance may be varied according to the value of the gain signal GIN, to the inverting input "−" of op-amp 502 which has its non-inverting input "+" connected to a reference voltage, in this case ground. A negative feedback loop with capacitance is provided between the output of the first op amp 502 and the inverting input so that op amp 502 serves as an integrator.

The output of the first op-amp 502 is input into a comparator 503 which has a second input connected to receive a reference signal Vref, which may be a periodic time varying reference signal, for example, a triangular or sawtooth signal. The comparator 503 compares the two comparator input signals and outputs a pulse modulated output signal DT as would be understood by a person skilled in the art. The periodic time varying reference signal Vref should have a relatively high frequency compared to the maximum frequency of the analogue input signal AIN, for example the frequency of Vramp, i.e. the PWM sample frequency $f_{PWM}$, may be of the order of about 3 MHz such that the input analogue signal AIN does not vary significantly during a period of the signal Vramp.

A feedback path is also provided between the output signal DT and the input of the first comparator amplifier 503 so that the first op-amp 502 acts as an integrating error amplifier. Reference voltages VRP and VRM may be used to provide a clean signal at an appropriate signal level to be fed back to the first op-amp 502 and a second variable impedance element 504 may be implemented to adjust the gain of the feedback signal in response to the signal GIN. This variable impedance element may be in addition to or instead of variable impedance element 501. The conversion gain of the converter in terms of say percentage duty cycle per volt is thus a function of the ratio of the variable impedances 501 and 504 and the value of the voltage difference between VRP and VRM. This conversion gain may alternatively be expressed in terms of say nanoseconds per volt by multiplying by the period of waveform Vref.

Preferably the feedback open-loop gain-bandwidth is high so that the open-loop gain at audio frequencies is high and thus the output pulse train accurately represents the input signal. To maintain stability, the output pulse frequency has to be greater than π times this loop bandwidth. However operating at higher frequencies will require generally involve a higher speed requirement for the op amp 502 and comparator 503. There is also some power required to switch between VRP and VRM. However this switching power is small compared to Class D power amplifiers with large driver transistors to drive low impedance loads. Thus rather than the 384 kHz or so common for power amplifiers, a frequency $f_{PWM}$ of 3 MHz or so may be a good compromise between performance and power.

As illustrated, if comparator 503 is a standard comparator which receives a ramp waveform Vref, e.g. a sawtooth waveform, with a fixed cycle period the modulator 202 will be a fixed frequency PWM modulator outputting a PWM signal such as illustrated as DT1 in FIG. 3a. The output from such a comparator could be input into a monostable multivibrator to generate a spike encoded, fixed frequency PWM signal such as illustrated as DT2 in FIG. 3a. If Vref is a triangular rather than sawtooth waveform then an output similar to DT3 of FIG. 3b would be produced. Comparator 503 could instead be implemented as a comparator where the comparator 503 compares the input from amplifier 502 to a fixed reference value Vref and which outputs a pulse of a fixed width when the input passes the reference value to produce a PWM signal such as DT4 illustrated in FIG. 3c. The comparator may also generate a spike at the leading or falling edge of the fixed width pulse to provide a variable frequency spike output similar to DT5 in FIG. 3c.

The reference voltages VRP and VRM may be constant. In some embodiments however these reference voltages may be modulated to provide at least some gain adjustment in response to GIN. A larger reference voltage will reduce the gain, so these reference voltages should be modulated according to 1/GIN, i.e. according to GO, so explicit calculation of GIN may not be necessary in such an implementation.

The signal fed back via impedance element 504 will switch between VRP and VRM in synchronism with the converter output DT. Any error or unintended variation of VRP and VRM will produce an error in the output DT that may be referred to the input as a similar variation or error in the input signal AIN. Thus it is important that the reference voltages are well controlled. However all the information in the output signal DT is conveyed in the timing of its edges rather than the amplitude, i.e. the levels A1 and A2 referred to with respect to FIG. 3. In many embodiments therefore DT may switch between relatively noisy or poorly controlled digital supply levels, provided that the noise or variation of such a supply is not so large as to corrupt the timing of the crossings of the crossings of the threshold between logic high and logic low.

The comparator 503 may in some embodiments not receive a periodic signal Vref, but instead may be a hysteric comparator which switches to one output state, say output high, when the input to the comparator reaches a first limit and maintains that state until the input reaches a second limit, different by a voltage ΔV, at which point the output state changes again. This type of self-oscillating modulator would produce a PWM waveform such as illustrated in FIG. 3d. Assuming the resistance of 501 and 504 are both equal to a value Rint and the feedback capacitor is of value Cint, and VRP=−VRM=VR, the integrator output will ramp linearly with a ramp rate of:

(VR−AIN)/RintCint in one direction and (AIN+VR)/RintCint in the other direction according to the state of DT. Thus the output pulse width W1 and will be proportional to:

ΔV.RintCint/(VR−AIN)

and the output pulse width W2 will be proportional to:

ΔV.RintCint/(AIN+VR).

Thus $W1-W2=2.\Delta V.RintCint.AIN/(VR^2-AIN^2)$.

$W1+W2=2.\Delta V.RintCint.VR/(VR^2-AIN^2)$, and $W1-W2/(W1+W2)=AIN/VR$, i.e. the duty cycle between any consecutive pair of high and low pulses is proportional to the input signal AIN despite the variation in the total time from one pair of pulses to the next.

In some embodiments the hysteresis ΔV may be modulated according to the input or output signal of the modulator to reduce the variation with signal of the PWM sample rate, i.e. PWM carrier frequency, and hence control possible issues arising from aliasing of components near the carrier frequency and multiple thereof. Returning briefly to FIG. 4a, this hysteresis control may be performed on the basis of the signal ST, rather than AINX, so as to be dependent on the output DT of the converter, being a digital representation of the input signal AM of the converter 201 itself, rather than of the input AIN.

FIG. 6 illustrates an alternative embodiment of a PWM modulator 401 that can be used as a first converter 201 according to an embodiment of the invention. In this example, the analogue input signal AIN is input into a first input of a comparator 601. A time varying periodic reference signal Vref, which may for example be a sawtooth signal of amplitude Hramp, is generated by ramp signal generation block 602 and input into the second input of the comparator 601. The output of comparator 601 changes at the point in each duty-cycle period where the ramp becomes equal to the input signal AIN, resulting in an output time encoded PWM signal DT comprising pulses of width linearly dependent on AIN, as would be understood by one skilled in the art.

A clock signal Framp may be input into the ramp signal generation block 602 with a constant frequency $f_{PWM}$ to define the duty cycle period. The frequency of the clock signal Framp may, for example, be of the order of 3 MHz as discussed above.

A second input of the ramp signal generation block 602 receives a conversion gain setting in order to set the voltage excursion Hramp of the reference waveform. The full-scale range of input signal AIN is equal to Hramp, i.e. the conversion gain is inversely proportional to Hramp. Thus the received conversion gain setting parameter may be GIN, and then Hramp derived inversely from GIN. Alternatively the received gain setting may be GO, and Hramp derived proportional to GO, since this GO equal to 1/GIN.

Alteration of the excursion Hramp of the reference signal Vref to which the analogue input signal AIN is compared alters the conversion gain of the modulator. Thus in some embodiments, such adjustment of Hramp in response to GIN or GO may supplement or replace other analogue gain elements such as variable impedance elements or preceding variable gain amplifier stages.

Figure 7A:
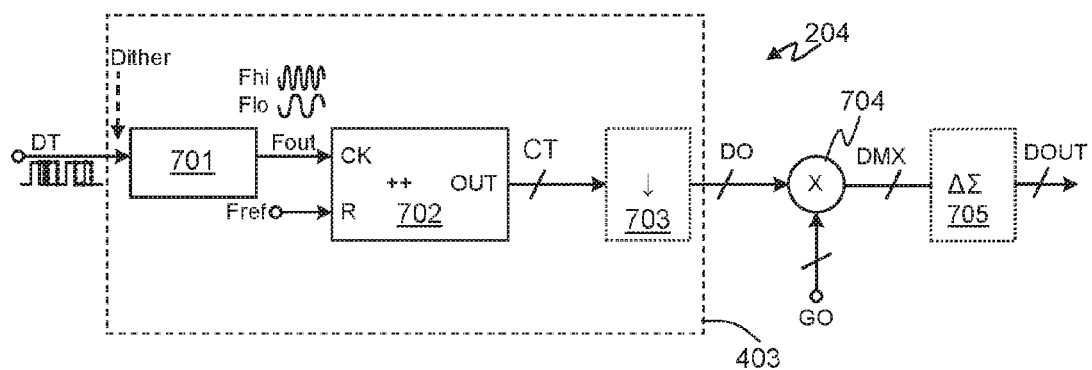
FIG. 7a illustrates an example of a second converter (time decoding block) according to an embodiment of the invention.

FIG. 7a illustrates an example of circuit that may be used as a time decoding block or second converter 204 according to an embodiment of the invention. The converter illustrated in FIG. 7a may be used to decode a fixed frequency PWM signal such as illustrated with reference to FIG. 3a. The time encoded signal DT is input into the PWM-to-digital modulator 403 which comprises a controlled oscillator 701, which in this embodiment is a voltage controlled oscillator (VCO). The controlled oscillator 701 outputs one frequency, Fhi, when the time encoded signal DT is high, and another lower frequency, Flo, when the time encoded signal DT is low. When DT is high, one voltage Vhi may be applied to VCO 701, and when DT is low a voltage \no may be applied to VCO 701. The output signal Fout of the VCO 701 thus varies between these two different frequencies Fhi and Flo, and is input into a counter 702. For example Fhi may be 300 MHz and Flo may be 100 MHz.

In some embodiments, one of the frequencies may be zero. In other words the VCO oscillation may be temporarily gated during pulse widths of one polarity of DT.

Figure 7B:
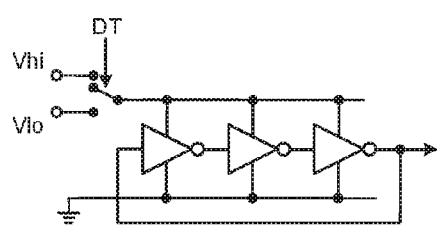
FIGS. 7b-7d illustrate suitable examples of controlled oscillators for such a converter.
Figure 7C:
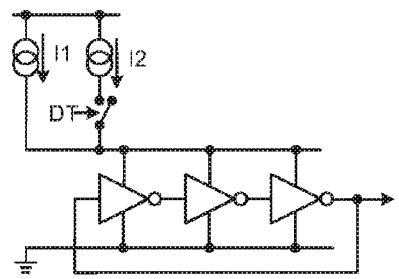
Figure 7D:
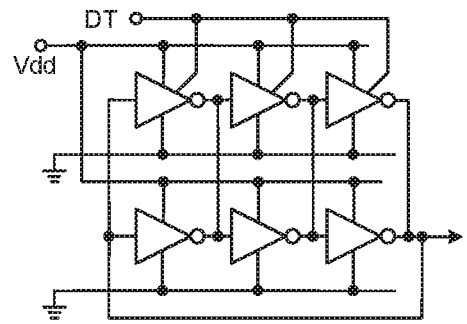

As mentioned the controlled oscillator may conveniently comprise a voltage controlled oscillator (VCO). One example of a suitable voltage controlled oscillator is illustrated in FIG. 7b. It should be noted however that the controlled oscillator need not be a linear VCO where frequency scales substantially linearly with voltage over a working range, it may for instance simply be any controlled oscillator that produces different frequencies, Fhi and Flo based on the state of DT. For example in another embodiment the controlled oscillator 701 may include a CMOS ring oscillator fed by either one current I1 or by a current I1+I2 based on the state of the time encoded signal DT as illustrated in FIG. 7c. The controlled oscillator could be a digitally controlled oscillator, for example in which the delay of one or more stages is varied. FIG. 7d illustrates a ring oscillator in which the drive strength applied to each node may be varied by activating a tri-stable inverter in parallel with a normal inverter. The load capacitance and parasitic capacitances on each node are largely unchanged by the activation of the parallel inverters but the drive strength is increased leading to an increase in the oscillation frequency. It is important to maintain residual phase at transitions of DT, so the state of each node and the effective phase of each point in the oscillator needs to be not disturbed too much on switching DT, but circuits such as above may be designed with small enough change. Note for ease of explanation the following embodiments will be described with reference to a VCO but it will be appreciated that other variants such as discussed above could be used.

Referring back to FIG. 7a the digital counter 702 counts the number of oscillations of the output signal Fout of the VCO 701 in a specific period defined by the frequency of an applied reference clock signal Fref. This reference clock signal Fref may, for a fixed frequency PWM signal, be set to equal the frequency $f_{PWM}$ of the PWM cycle and may, for example, be of the order of 3 MHz or so. The count value CT produced by the counter 702 during one period of the clock signal Fref will depend on the duration of time that the input time-encoded signal DT spent in the high state, and thus with the higher frequency VCO output Fhi, compared to the duration of time that the input time-encoded signal DT spent in the low state. The count value CT is thus related to the duty cycle of the received PWM signal, i.e. the time encoded signal DT, and can be output as a digital signal.

For example if the clock signal Fref has a frequency of 3 MHz and the high and low frequencies output from the VCO 701 are 300 MHz and 100 MHz respectively then a steady-state 100% high duty cycle would lead to an expected average count value of 100 and a steady-state 100% high duty cycle would lead to an expected average count value of 33.3. The count value would scale linearly between these values with duty cycle. There may be some processing within the counter 702, or optionally via a separate processing block (not shown), to re-center or normalize the count value CT to a convenient range.

The conversion gain is also directly dependent on the difference between the VCO frequencies Fhi and Flo. To account for manufacturing variation or temperature dependent variations or the like there may be one or more reference VCOs fed with a reference voltage, for example the same high and low voltages Vhi and Vlo as provided to VCO 701, in order to provide at least one reference count value which may be used to normalize the output of counter 702. Alternatively a reference VCO in a servo loop fed with the desired frequencies Fhi and/or Flo may be used to provide appropriate adjustments to Vhi or Vlo no or some other common bias.

The VCO oscillation frequency will not usually be an integer multiple of Fref. Thus there is an error that may be regarded as quantization noise produced by occurrence of only a partial cycle of the output signal Fout in a given period of the reference signal Fref. However, unlike a simple counter which would be reset and lose such information every Fref period, in a controlled oscillator-based circuit the error is carried over and remembered as a phase advance of the oscillation to the next Fref period, rather than the partial cycle being truncated and lost, so a cumulative or average count over many Fref cycles is d.c. accurate. This quantization noise is thus first-order noise shaped to appear at higher rather than lower frequencies. In other words, while this quantization will be apparent when observing just one sample of the counter output, the noise will average out when multiple samples are averaged.

However, if for example the d.c. level of the VCO high frequency is such that there is 1/1000 of an extra cycle every Fref period, then 999 cycles of Fref will give the same count, and every $1000^{th}$ cycle will give an extra count increment. This will appear at the output as equivalent to a pulse train of say 3 MHz/1000=3 kHz, giving tones at 3 kHz and harmonics. Other tones falling within the audio band may be generated similarly by other d.c. or a.c. signals, including sidebands of the input PWM carrier.

To avoid such effects, as is known in the general field of delta-sigma modulation, a dither signal may be added to the input of the VCO to randomize the sequence of counts, to avoid such spurious signal-band signals, and help obtain an effective resolution greater than that corresponding to the average count value. This dither signal may be generated to have relatively little power in the signal band and higher power at higher frequencies, and be of amplitude of several or many LSBs of the counter output.

Thus, although improving noise performance in the signal band, the dither signal will modulate the count signal such that it is no longer so accurate in any single given Fref period. Such error in each individual sample does not cause any quality issues for the output of the converter 202 as the digital output DOUT can be accurately derived from the longer term average of the counter values (that may be decimated as required). However this does mean that the output of the counter 702 cannot be used on a sample by sample basis to monitor the amplitude of the input signal with low latency. Hence the converter 202 is optimized for signal band quality and it output would not be suitable for use for controlling the allocation of gain.

As explained above, the simple VCO and counter embodiment of the second converter 204 reduces quantization noise in the signal band, at the expense of extra quantization noise at higher frequencies, in a similar fashion to a conventional first-order delta-sigma converter. For embodiments requiring better signal-band signal-to-noise second-order (or indeed higher-order) the second converter 204 may comprise second-order VCO-based structures as would be understood by one skilled in the art.

Such structures provide reduced quantization noise in the signal band, at the expense of even greater quantization noise at medium frequencies (i.e. a sharper downstream filter cut-off is required), thus rendering them even less suitable for use in control of the dynamic range extension.

In some embodiments, Fref may not be equal to $f_{PWM}$. To reduce quiescent power consumption, Fref is normally chosen as low as possible sufficient to provide stability and adequate loop gain to suppress signal band distortion. The "sample frequency" Fref used to reset and transfer the counter outputs may advantageously be greater than Fref. As known in the field of delta-sigma modulation in general, the quantization noise may be reduced by operating at a higher sample frequency, while the counter and associated digital operations consume relatively little power. It may be preferable to operate Fref at a frequency that is not a simple multiple of $f_{PWM}$ to reduce issues arising from aliasing of PWM carrier and sideband components. Note that the "sampling" operation of the counter is really an accumulation or averaging of the number of VCO cycles over a period, so the exact timing of the Fref clock relative to the $f_{PWM}$ clock CK is not important: any cycle missed in one counter output sample will be caught during the next count, and the counts are effectively all approximately added together in downstream low-pass decimator filtering.

If the digital output signal is only required to a certain output resolution then only the most significant bits (MSBs) need be extracted from the counter 702. However in this case to provide the benefits of averaging across cycles only the most significant bits should be reset by the reset signal. The quantization noise represented by the less significant bits that are not reset then appears at the output noise-shaped similarly to the partial-cycle quantization noise.

The output CT from the counter 702 may in some instances be used as the output signal DO from the PWM-to-digital modulator 206. However in some embodiments the modulator 403 may comprise a decimator 703 or the like for reducing the sample rate of the counter output from the rate of the clock signal Fref. Such a decimator may include a low pass filter or similar, so will average the signal over many clock cycles, thus removing the above counter quantization noise and any high frequency added dither components. The digital output signal produced by the decimator 703 may for instance be a multi-bit PCM word at an audio sampling frequency or a relatively small multiple thereof.

The digital output signal DO may be input into a digital multiplier 704 to multiply the signal by the conversion gain setting GO in order to compensate for the effect of the dynamic range extension and to produce a conventional digital signal representative of the analogue input signal AIN.

In some embodiments, the decimator 703 may be absent (or may be positioned after the gain element 704), and this gain adjustment could be performed on the output from the counter 702 prior to any decimation. However it is generally more efficient to perform the multiplication on a decimated signal, at the reduced sample rate.

In some embodiments the output DMX of the digital multiplier 704 may provide the required digital output signal DOUT. In some embodiments however there may be further signal processing to provide the required output signal. For example as illustrated in FIG. 7a the gain adjusted digital output signal DMX may be input into a delta sigma modulator 705 in order to re-modulate the signal into a pulse density modulated stream which is output as the digital output signal DOUT for use downstream, for example for transmission in a simple one-bit serial format down a cable from a microphone to a device such as a cellphone.

The second converter 403 illustrated with reference to FIG. 7a is particularly suitable for decoding a fixed frequency PWM signal such as illustrated as DT1 in FIG. 3a. The VCO 701 could also be configured to output the high frequency Fhi at the start of a duty cycle period as determined by a clock signal and then change to the low frequency when a suitable rising or falling edge is detected to operate with a spike encoded PWM signal such as DT2 illustrated in to FIG. 3a, or alternatively the dual edge modulated signal DT3 of FIG. 3b or the fixed on-time signals DT4 or DT5 of FIG. 3c.

For time-decoding a waveform such as the variable-period waveform DT6 illustrated in FIG. 3d, it should be noted that although the effective PWM sample period W1+W2 varies from cycle to cycle, the signal is still represented accurately in each cycle by the duty-cycle (W1−W2)/(W1+W2), and so if the counter 702 were also read and reset at the end of each of these variable periods the signal would be accurate cycle-by-cycle. However it is usually desired to provide the digital output signal DOUT at a constant sample rate. If the counter 702 is read and reset at a constant sample rate then there will be sample-to-sample variations in the output even for a constant or slowly varying signal: however the long term average of the counts, representing the average duty cycle, will still accurately represent the average signal value over time. The range over which the PWM sample frequency varies with signal and the output sample rate may however need to be designed with respect to each other such that harmonics of the PWM carrier and sidebands do not fall at frequencies where they may be aliased down into the signal frequency band.

Similar schemes may be derived for other non-uniformly sampled time-encoded signal formats from e.g. constant-on-time conversion as illustrated in FIG. 3c.

Referring back to FIG. 4a, the signal chain from AIN through first converter 201 and second converter 202 and any further processing to DOUT has to be designed to optimize the overall resolution and noise spectrum. In general the resolution provided by the second converter 202 and/or the signal processing delays inherent in such a block mean that the output signal DOUT and even the intermediate signal DO are not suitable for use for gain allocation control for dynamic range extension. As mentioned the gain allocation block 204 needs to respond quickly to any increases in input signal AIN level and thus any digital representation of the input signal AIN should be produced with a relatively low latency. The PWM-to-digital modulator 403 illustrated in FIG. 7a may not provide a suitably low latency and/or a signal of the suitable resolution and may not be modifiable to provide a more suitable signal without compromising the performance of the main signal path. Further the use of dither applied to the VCO to avoid issues of tones means that the individual sample by sample count values are not accurate representations of the signal DT. In embodiments of the present invention the gain allocation block 204 therefore comprises an auxiliary time decoding modulator 203, which may be a second PWM-to-digital modulator. In some embodiments therefore an input signal DT to the gain allocation block may be coupled to an output of the first converter 201 to receive the PWM signal, e.g. directly without any intermediate processing, and the gain allocation block 204 may use the received PWM signal DT for gain allocation control. The signal DT used for gain allocation control is thus independent of the second converter 202.

Figure 8:
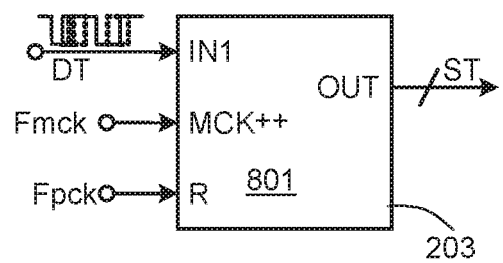
FIG. 8 illustrates an example of an auxiliary time decoding modulator according to embodiments of the invention.

FIG. 8 illustrates an example of an auxiliary time decoding modulator 203 according to an embodiment of the invention. In general, the auxiliary time decoding modulator 203 may operate with relaxed constraints regarding noise performance and possibly resolution compared to the time decoding modulator 403 and/or possibly with a lower latency. Thus the auxiliary time decoding modulator 203 may use a generally simpler, but possibly faster and/or less accurate, conversion process to produce a time decoded signal ST that is representative of DT which is representative of the gain-adjusted analogue input signal AM.

In this example, the auxiliary time decoding modulator 203 may comprise a counter 801. The time encoded signal DT may be provided to a first input IN1 of a counter 801 which may be an enable input so as to either enable the counter, for example when the signal is high, or disable the counter, for example when the signal is low. A first, high rate, clock signal Fmck is also input into the counter 801 at a counter input MCK so that the counter (when enabled) increments (or decrements) the counter every MCK period when DT is high. A second clock signal Fpck is provided to a reset input to define a count period. When the time encoded signal is a fixed frequency PWM signal the second clock signal Fpck may have the same frequency $f_{PWM}$ as the PWM signal, e.g. around 3 MHz.

The first clock signal Fmck has a frequency greater than the second clock signal Fpck by an amount sufficient to give a desired output resolution, e.g. Fmck of the order of 300 MHz for a Fpck of say 3 MHz, to give a maximum count of the order of 100. In contrast to the output of counter 701 there is no noise shaping of the resulting quantization noise to improve signal band signal-to-noise as discussed above with respect to FIG. 7a, but there may also be no dither added to DT, so for a given Fpck cycle the count may be more accurate.

The counter 801 thus counts the number of Fmck clock pulses whenever it is enabled, e.g. when the time encoded signal DT is high. After each cycle of the reference signal Fpck, the counter block outputs the number of clock pulses it has counted during that period as the signal ST, thereby giving a measure of the width of the pulse in the time encoded signal DT.

The counter 801 could instead be configured as an up/down counter and thus the signal provided at the first input IN1 could toggle between incrementing and decrementing the count value. The count value in a period would thus correspond to the difference in the period between the duration of periods of high signal level and low signal level in the PWM signal DT.

In general therefore the second time decoding modulator 203 may comprise a counter that determines a count of the number of periods of a clock signal during an interval defined by the pulse or pulses of the PWM signal, i.e. the periods between the relevant signal transitions as discussed above in relation to FIG. 3.

Figure 9:
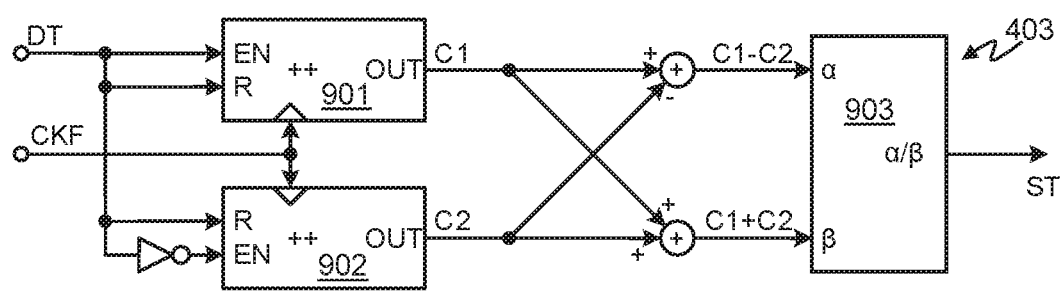
FIG. 9 illustrates an example of an alternative auxiliary time decoding modulator according to embodiments of the invention.

FIG. 9 illustrates an embodiment of an auxiliary or second time decoding modulator 403 for time-decoding a waveform such as DT6 illustrated in FIG. 4$d$ by measuring the duty cycle, i.e. (W1−W2)/(W1+W2). The circuit of FIG. 9 comprises a pair of counters 901 and 902 that are enabled when DT is high or low respectively. These counters are sampled and reset on say the leading edge of each transition of DT6 from low to high, and thus generate counts over the interval between the start of one high pulse and the start of the next one, these counts C1 and C2 corresponding to the widths W1 and W2. These counts may be added and subtracted as shown to provide C1+C2 and C1−C2, which may then be divided by divide block 903 to provide the output ST. ST will be calculated at intervals which vary with the current and previous history, each output sample representing the signal over a respective variable time interval.

In some embodiments, the signal DT may comprise more than one signal line. The first converter may output a differential logic signal, comprising two mutually inverse physical outputs. One or both of these may be used to drive a single VCO. However each may be used to drive a separate VCO driving a separate counter, whose outputs may be subtracted to give a net output signal.

Figure 10A:
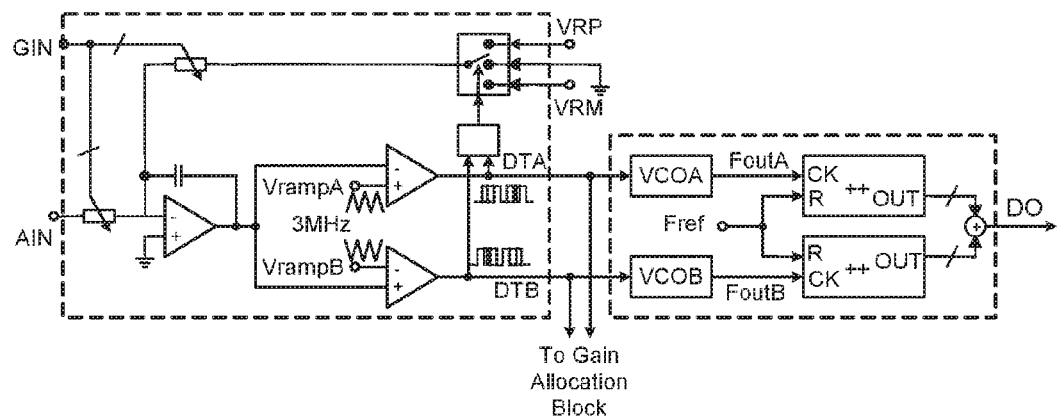
FIG. 10a illustrates an ADC according to an embodiment of the invention with two wire encoding and FIG. 10b illustrates example waveforms.
Figure 10B:
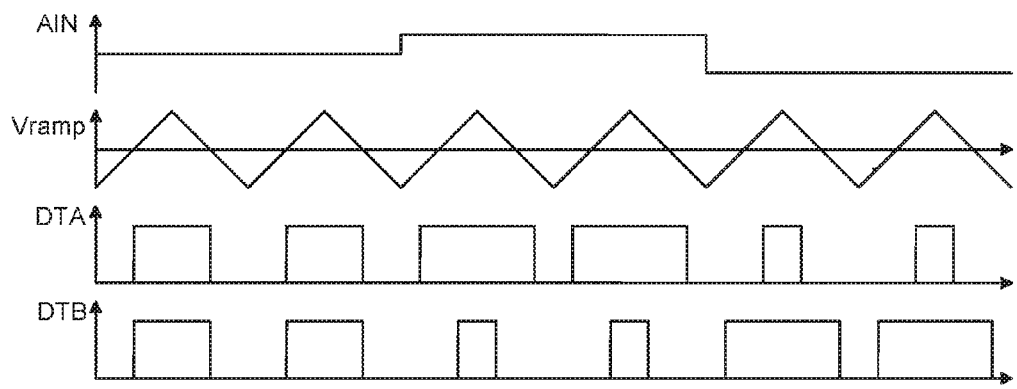

FIG. 10$a$ illustrates an embodiment in which the signal DT comprises two signal lines carrying components of signal DT that are not mutually inverse. The circuit shown is similar to that of FIG. 5, with input AIN feeding into the virtual earth of an integrator comprising an op amp, where it is compared to a fed back signal based on the digital PWM or time-encoded output signal. However the integrator output is coupled to two comparators rather than one comparator, where it is compared against two different ramps, possibly inverse waveforms, so the comparators generally switch at different times. Thus, as can be seen by example waveforms in FIG. 10$b$, the time-encoded signal now comprises two signals DTA and DTB which are not merely mutually inverse equivalents of each other. These may be passed to a second converter which may comprise respective VCOs and counters as illustrated, and the output of the counters may be subtracted to provide a net digital signal.

Figure 11:
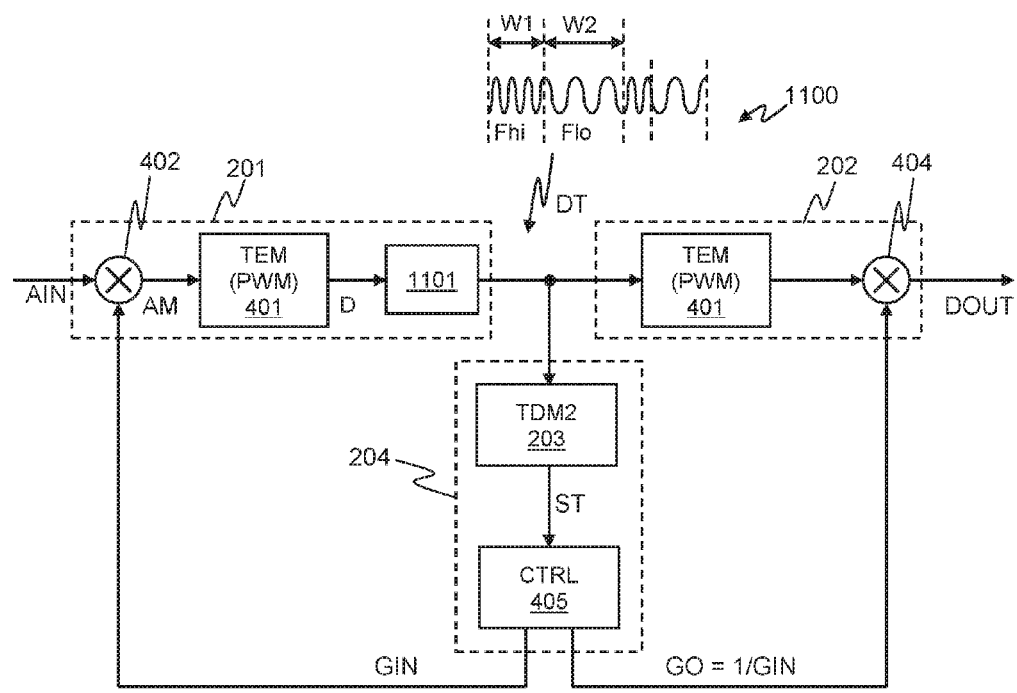
FIG. 11 illustrates a further embodiment of an ADC.

In some embodiments, the two states of signal DT may be represented by currents rather than voltages. In some embodiments the two states of signal DT may be represented by other variables, such as two different frequencies Fhi and Flo generated by a controlled oscillator 1101 fed by a two-level signal D (itself a time encoded signal) in the first converter 201 as illustrated in FIG. 11. The value of DT is still represented by the time intervals between the transitions between the two different frequencies, but this frequency domain representation simplifies the downstream time-to-digital conversion, which may then be performed by a simple counter 801 such as discussed with reference to FIG. 8. The clock signal Fpck used to reset the counter 801 may also be derived from the clock signal Fref used to reset a counter within converter 204 or may be a multiple or sub-multiple frequency or may be an unrelated frequency.

Figure 12:
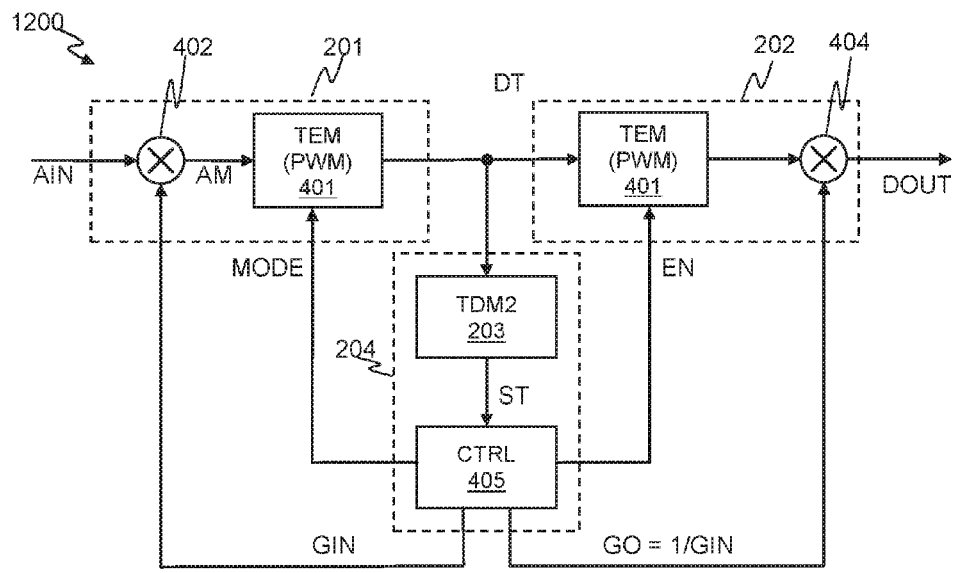
FIG. 12 illustrates a further embodiment of ADC which is operable in two modes.

FIG. 12 illustrates an embodiment in which the ADC may be operable in two modes. In a first mode the ADC may operate as described above, i.e. to convert an input signal Ain to an output digital signal DOUT with the gain allocation block 204 operative to control the allocation of gain for dynamic range extension. In the second mode the first converter 201 may be operative but the second converter 202 is inactive. In this second mode, the output of converter 201 is monitored by block 204, which is used to discriminate whether the input signal AIN contains any useful information, for instance the presence of a voice signal rather than ambient noise. When the presence of useful information is detected, then the second converter 202 is activated via line EN as illustrated. Thus a standby mode with lower power may be achieved.

In this standby mode the gain allocation block 204 may still provide a gain adjustment for the first converter, to enable optimum sensitivity and reduce false triggers produced by noise, or it may disable such calculations to save power consumption.

In standby mode, the bias or configuration of the first converter 201 may also be adjusted, by means of control line MODE as illustrated. For instance the bias current of the amplifiers or comparator may be reduced at the expense of noise or distortion. The modulator topology may also be re-configured by suitable switching of signal routing, for instance to change from the closed-loop topology of FIG. 5 to the open-loop topology of FIG. 6, thus allowing the op amp 502 to be powered down to further reduce power consumption in this mode. The PWM sample rate may also be reduced to save power, for instance by dividing-down the applied clock or in the case of a hysteretic converter by altering the value of applied hysteresis.

Analogue-to-digital conversion circuits such as described herein may be used in a range of different applications. In particular, the conversion circuits may be used in MEMS microphone circuits for receiving audio signals driving an audio transducer such as a headphone, headset or earphone, or an on-board transducer or a host device. Embodiments of the invention may be suitable for active noise cancellation circuits or may be arranged as part of an audio and/or signal processing circuit, for instance an audio circuit which may be provided in a host device. An analogue-to-digital conversion circuit according to an embodiment may be implemented as an integrated circuit and may be implemented in a host device, especially a portable and/or battery powered host device such as a mobile telephone, an audio player, a video player, a PDA, a mobile computing platform such as a laptop computer or tablet and/or a games device for example.

As used herein the term block refers to a functional unit or module which may be implemented by one or more circuit components and which may for instance comprise dedicated circuitry. A block may additionally or alternatively comprise one or more software modules running, for instance on a general purpose processor or suitably programmed FGPA array or the like. Computer readable code comprising instructions for such software modules may be stored in any suitable non-transitory storage medium such as a suitable memory which may for instance be some general device memory. The components of a block do not need to be physically co-located and the components of one block may in some applications be shared with components of another block.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Additionally the term "gain" does not exclude "attenuation" and vice-versa. Any reference numerals or labels in the claims shall not be construed so as to limit their scope.

The invention claimed is:

1. An analogue to digital converter for converting an analogue input signal into a corresponding digital output signal comprising:
   a first time encoding converter for receiving said analogue input signal and outputting a time encoded signal based on said analogue input signal and a first conversion gain setting, wherein the time encoded signal encodes the analogue input signal by the timing of signal transitions that can vary continuously in time,
   a first time decoding convertor for receiving said time encoded signal and outputting said output digital signal based on said time encoded signal and a second conversion gain setting; and
   a gain allocation block for generating the said first and second conversion gain settings based on the time encoded signal;
   wherein the first time encoding converter is configured to encode the analogue input signal by the duration of pulse defined by a first signal transition and a second signal transition.

2. An analogue to digital converter as claimed in claim 1 wherein said gain allocation block comprises:
   a second time decoding convertor configured to receive a version of said time encoded signal and output a control digital signal based on said time encoded signal; and
   a controller for receiving said control digital signal to control said first and second conversion gain settings.

3. An analogue to digital converter as claimed in claim 2 wherein said second time decoding convertor has a lower latency than said first time decoding convertor.

4. An analogue to digital converter as claimed in claim 2 wherein said second time decoding convertor has a lower output resolution than said first time decoding convertor.

5. An analogue to digital converter as claimed in claim 2 wherein the second time decoding convertor comprises a first counter configured to receive a first clock signal and determine a count of the number of periods of the first clock signal during an interval defined by signal transitions of the time encoded signal.

6. An analogue to digital converter as claimed in claim 5 wherein the second time decoding convertor further comprises a second counter, wherein the first counter is configured to determine a first count of the number of periods of the first clock signal during an interval of a first state of the time encoded signal and the second counter is configured to determine a second count of the number of periods of the first clock signal during an interval of a second state of the time encoded signal and the second time decoding convertor is configured to determine a duty-cycle value from said first and second counts.

7. An analogue to digital converter as claimed in claim 1 wherein the time decoding converter comprises a controlled oscillator configured to output an oscillation signal at a first frequency during a first state of the time encoded signal.

8. An analogue to digital converter as claimed in claim 7 wherein the controlled oscillator is configured to output the oscillation signal at a second, different frequency during a second state of the time encoded signal.

9. An analogue to digital converter as claimed in claim 8 wherein the time decoding converter comprises a counter configured to count the number of oscillations of the oscillation signal in a count period and a signal processing module for converting the output of the counter to the digital output signal.

10. An analogue to digital converter as claimed in claim 2, the analogue to digital converter being operable in first and second modes, wherein:
    in the first mode said first time decoding convertor outputs said digital output signal based on the time encoded signal; and
    in the second mode the first time decoding converter is inactive and an activity controller is responsive to the digital control signal produced by the second time decoding to determine whether to switch to the first mode of operation.

11. An apparatus comprising an analogue to digital converter as claimed in claim 1 and a transducer, wherein said analogue input signal for the analogue to digital converter is generated by said transducer.

12. An electronic device comprising an analogue to digital converter as claimed in claim 1 wherein said device is at least one of: a portable device; a battery powered device; a communications device; a mobile or cellular telephone; a personal media device; a computing device; a laptop, notebook or tablet computer; a gaming device; a wearable device.

13. An analogue to digital converter for converting an analogue input signal into a corresponding digital output signal comprising:
    a first time encoding converter for receiving said analogue input signal and outputting a time encoded signal based on said analogue input signal and a first conversion gain setting, wherein the time encoded signal encodes the analogue input signal by the timing of signal transitions that can vary continuously in time;
    a first time decoding convertor for receiving said time encoded signal and outputting said output digital signal based on said time encoded signal and a second conversion gain setting; and
    a gain allocation block for generating the said first and second conversion gain settings based on the time encoded signal;
    wherein said first time encoding converter comprises a hysteric comparator configured to compare a first signal based on the analogue input signal to first and second limits and to switch between first and second output states when the first limit is reached and switch between second and first output states when the second limit is reached.

14. An analogue to digital converter as claimed in claim 13 wherein said time encoding converter comprises an integrator configured to integrate said analogue input signal to produce said first signal input to the hysteric comparator.

15. An analogue to digital converter as claimed in claim 13 wherein said time encoding converter is configured to vary the first and second limits based on an indication of the magnitude of the analogue input signal.

16. An analogue to digital converter for receiving an input analogue signal and outputting an output digital signal comprising:
    a first converter for converting the input analogue signal to a time encoded signal;
    a second converter for converting the time encoded signal to a first digital signal which is output as the output digital signal;
    a third converter for converting the time encoded signal to a second digital signal with lower latency and/or resolution than the second converter; and a gain allocation block for controlling an analogue gain of the first converter and a digital gain of the second converter;

wherein the gain allocation block is configured to control said analogue gain and said digital gain based on the second digital signal.

17. An analogue to digital converter for converting an analogue input signal into a corresponding digital output signal comprising:

a time encoding block for converting said analogue input signal to a time encoded signal with a first conversion gain;

a time decoding block for converting the time encoded signal to said digital output signal with a second conversion gain; and a gain allocation block coupled to an output of the time encoding block to receive a version of the time encoded signal and configured to control said first and second conversion gains based on the received time encoded signal;

wherein the time decoding block comprises a controlled oscillator configured to output an oscillation signal at a first frequency during a first state of the time encoded signal.

* * * * *